(12) United States Patent
Karhade et al.

(10) Patent No.: US 12,176,268 B2
(45) Date of Patent: Dec. 24, 2024

(54) OPEN CAVITY BRIDGE CO-PLANAR PLACEMENT ARCHITECTURES AND PROCESSES

(71) Applicant: Intel Corporation, Santa Clara, CA (US)

(72) Inventors: Omkar Karhade, Chandler, AZ (US); Digvijay Raorane, Chandler, AZ (US); Sairam Agraharam, Chandler, AZ (US); Nitin Deshpande, Chandler, AZ (US); Mitul Modi, Phoenix, AZ (US); Manish Dubey, Chandler, AZ (US); Edvin Cetegen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1066 days.

(21) Appl. No.: 16/828,405

(22) Filed: Mar. 24, 2020

(65) Prior Publication Data

US 2021/0305132 A1 Sep. 30, 2021

(51) Int. Cl.
| | |
|---|---|
| *H01L 23/48* | (2006.01) |
| *H01L 23/482* | (2006.01) |
| *H01L 23/495* | (2006.01) |
| *H01L 23/538* | (2006.01) |

(52) U.S. Cl.
CPC .... *H01L 23/4821* (2013.01); *H01L 23/49503* (2013.01); *H01L 23/5381* (2013.01)

(58) Field of Classification Search
CPC ......... H01L 23/48; H01L 23/481–4828; H01L 23/485; H01L 23/5381; H01L 23/5383–5385
See application file for complete search history.

(56) References Cited

U.S. PATENT DOCUMENTS

| | | | | |
|---|---|---|---|---|
| 10,163,798 | B1* | 12/2018 | Alur | H01L 24/16 |
| 10,373,893 | B2* | 8/2019 | Vaidya | H01L 21/76898 |
| 10,418,329 | B2* | 9/2019 | Li | H01L 24/73 |
| 2020/0168538 | A1* | 5/2020 | Ong | H01L 25/0652 |

FOREIGN PATENT DOCUMENTS

| | | |
|---|---|---|
| JP | 2012-074449 | 4/2012 |
| JP | 2012-529770 | 9/2014 |

OTHER PUBLICATIONS

Office Action from Japanese Patent Application No. 2020-190576, mailed Oct. 6, 2024, 5 pgs.

* cited by examiner

*Primary Examiner* — Hoa B Trinh
(74) *Attorney, Agent, or Firm* — Schwabe, Williamson & Wyatt P.C.

(57) ABSTRACT

Embodiments disclosed herein include multi-die packages with open cavity bridges. In an example, an electronic apparatus includes a package substrate having alternating metallization layers and dielectric layers. The package substrate includes a first plurality of substrate pads and a second plurality of substrate pads. The package substrate also includes an open cavity between the first plurality of substrate pads and the second plurality of substrate pads, the open cavity having a bottom and sides. The electronic apparatus also includes a bridge die in the open cavity, the bridge die including a first plurality of bridge pads, a second plurality of bridge pads, and conductive traces. An adhesive layer couples the bridge die to the bottom of the open cavity. A gap is laterally between the bridge die and the sides of the open cavity, the gap surrounding the bridge die.

6 Claims, 10 Drawing Sheets

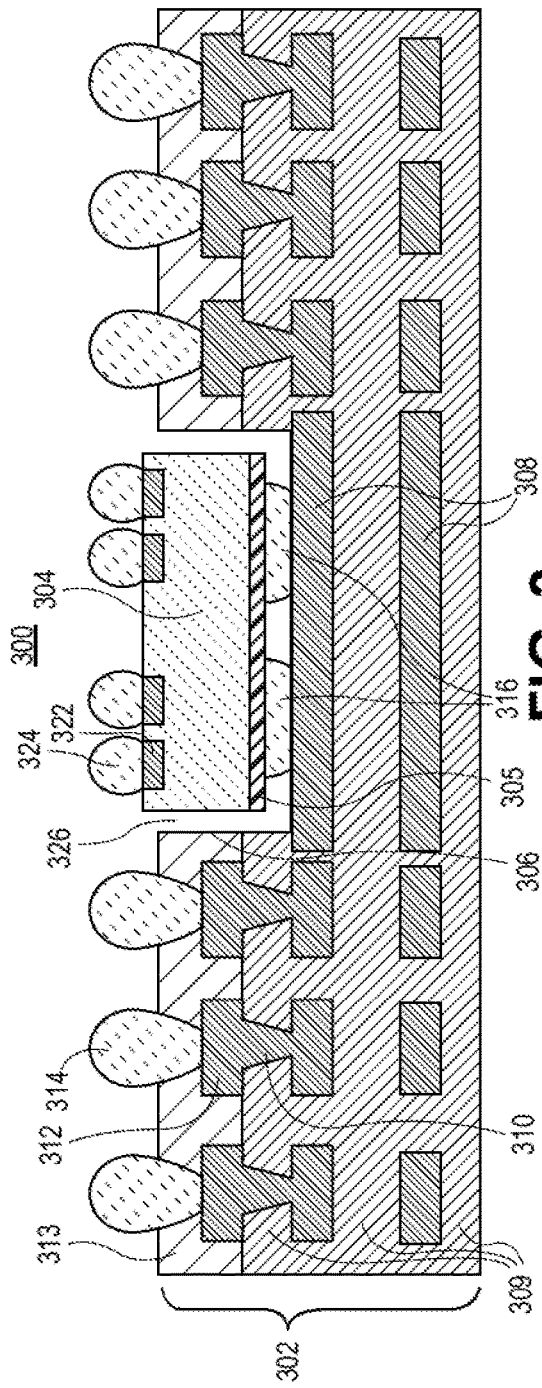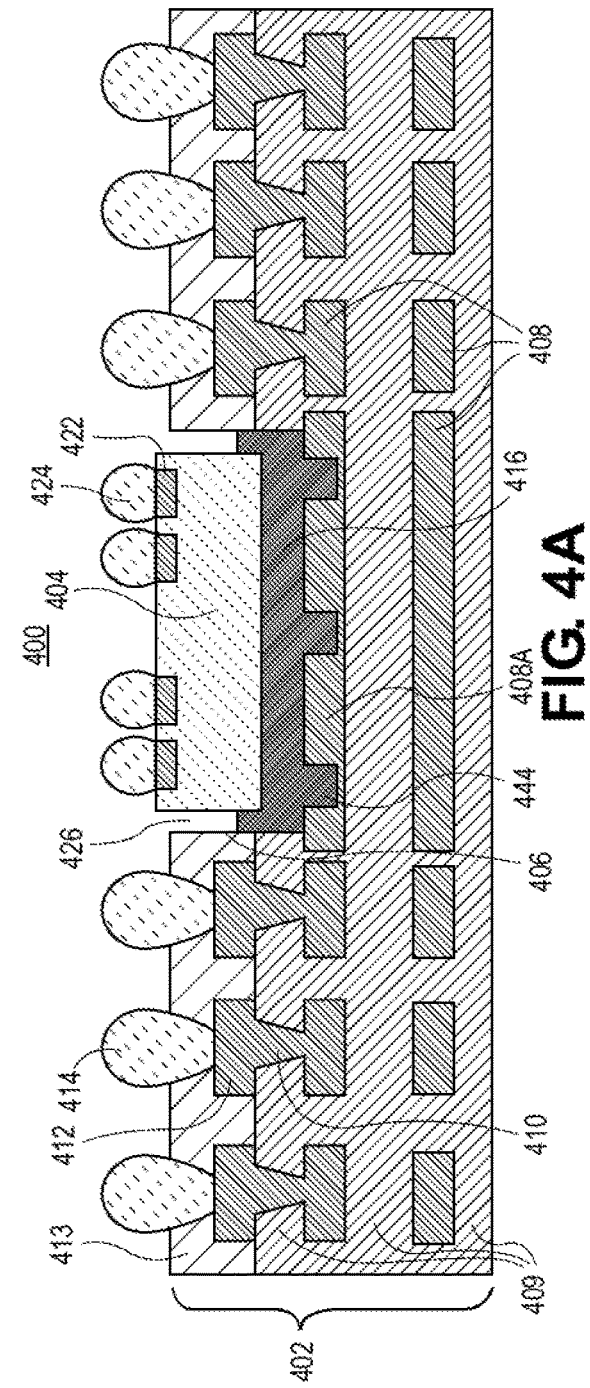

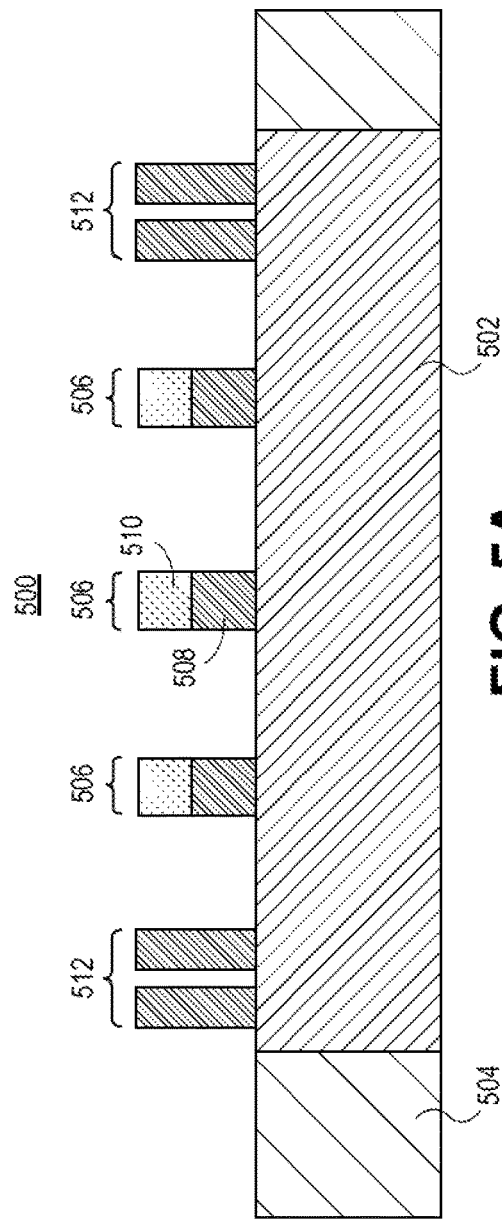
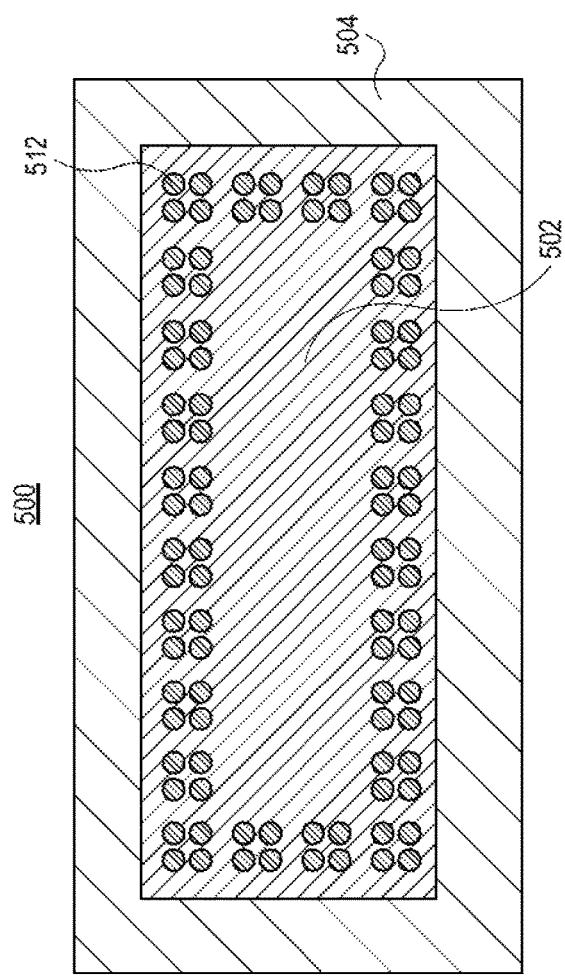

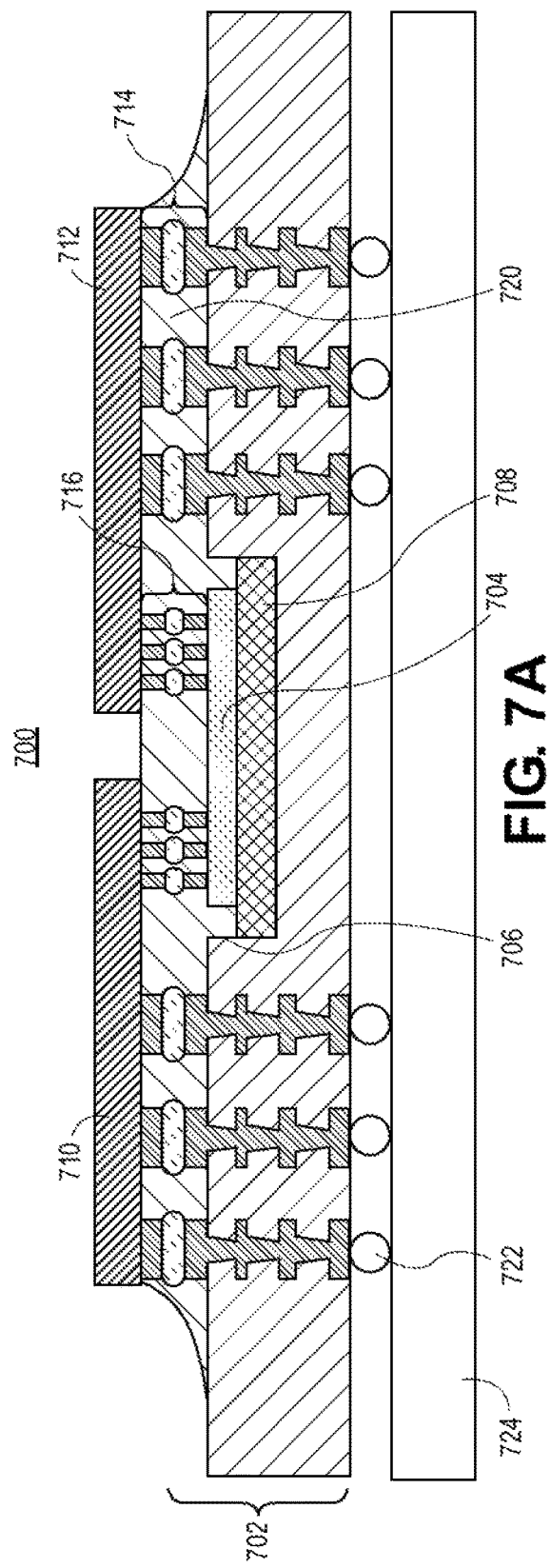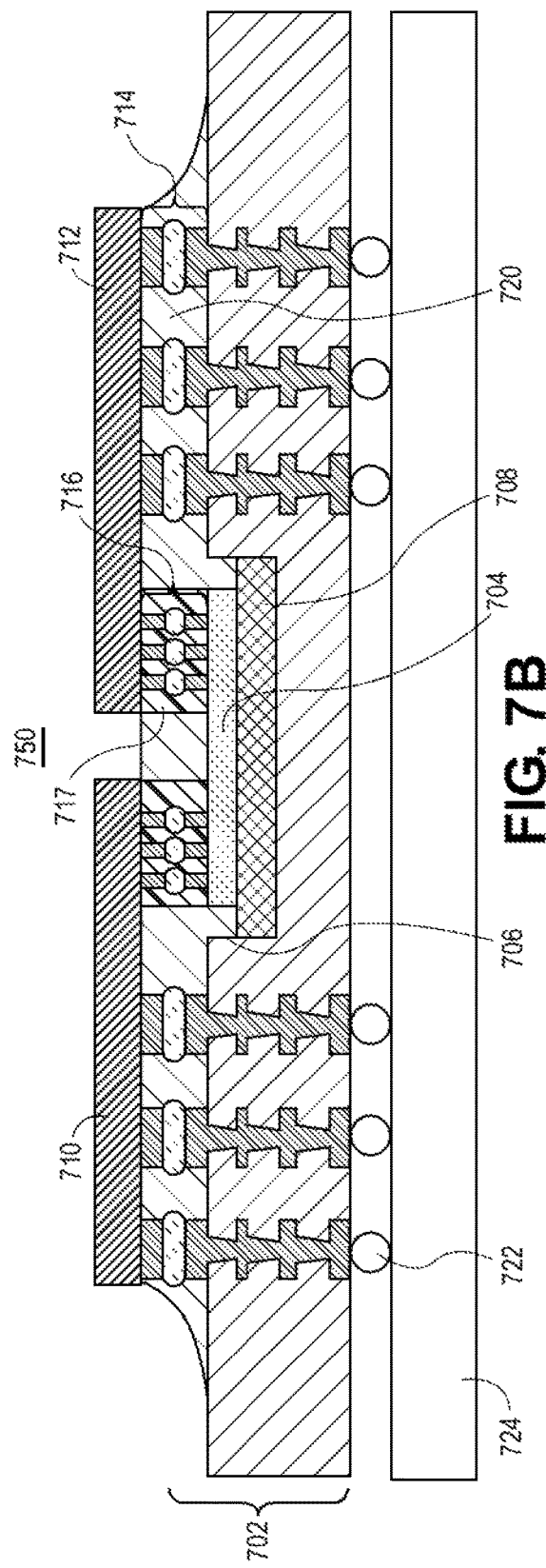

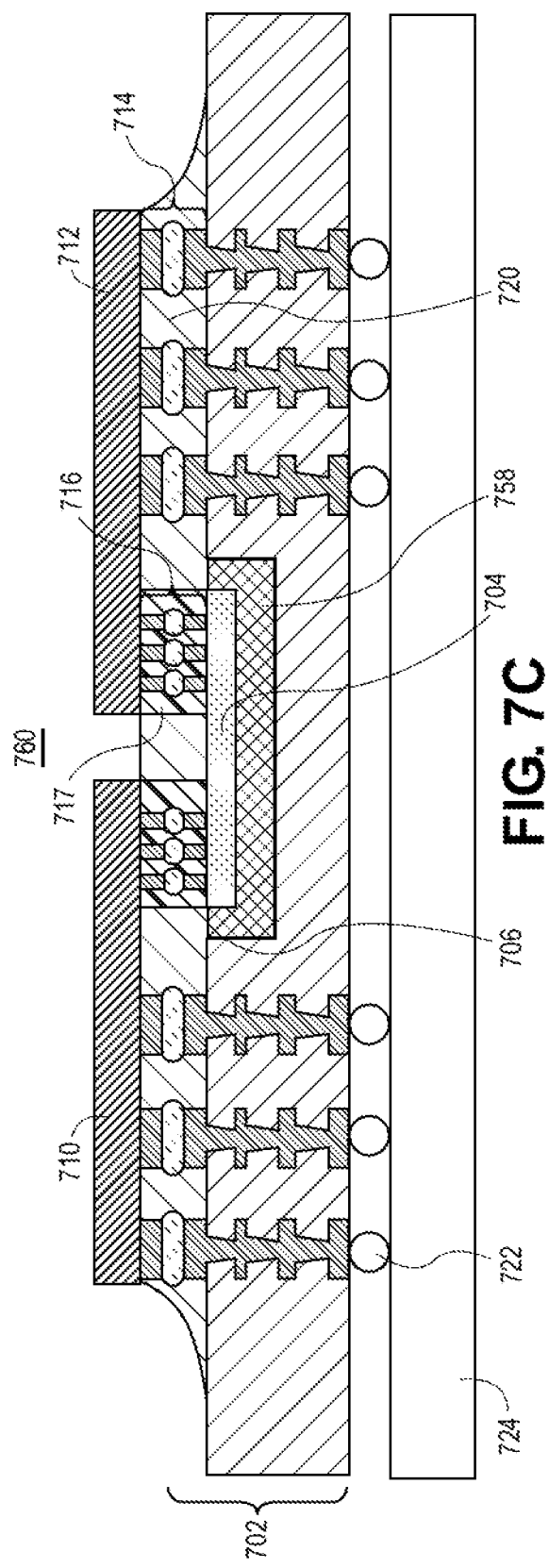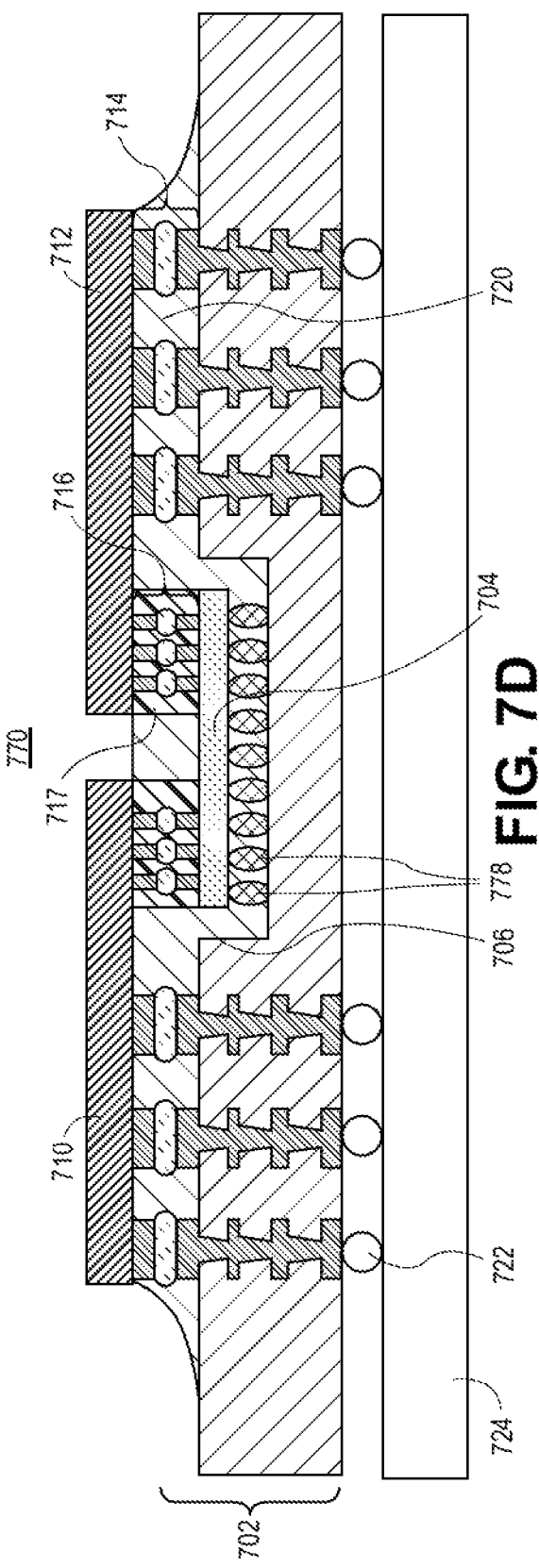

OPEN CAVITY BRIDGE CO-PLANAR PLACEMENT ARCHITECTURES AND PROCESSES

TECHNICAL FIELD

Embodiments of the present disclosure relate to semiconductor devices, and more particularly to a multi-die package with an open cavity bridge.

BACKGROUND

The demand for miniaturization of form factor and increased levels of integration for high performance are driving sophisticated packaging approaches in the semiconductor industry. One such approach is to use die partitioning to enable miniaturization of small form factor and high performance. Such architectures depend on fine die-to-die interconnects to couple the partitioned dies together. Embedded multi-die interconnect bridges (EMIBs) have been used to provide the fine die-to-die interconnects. However, EMIBs also have their own integration challenges.

One challenge is that EMIBs suffer from a high cumulative bump thickness variation (BTV). BTV is becoming an even greater engineering hurdle as more EMIBs are included in a package and as the sizes of the EMIBs increase. Placing the EMIBs onto a glass patch has been proposed to reduce the BTV and improve warpage. However, the glass patch is a thick substrate that has low thermal conductivity. Accordingly, thermocompression bonding (TCB) is not suitable for the mid-level interconnects (MLIs). Accordingly, the pitch of the MLIs needs to be increased in order to accommodate alternative bonding techniques, such as traditional chip attach module (mass reflow) process. Increasing the pitch of the MLIs requires the use of one or more redistribution layers disposed over the glass patch. The redistribution layers negate the BTV benefits provided by the glass, and is not a desirable solution.

BRIEF DESCRIPTION OF THE DRAWINGS

FIG. 3 is a cross-sectional illustration of another electronic package with an open cavity bridge, in accordance with another embodiment of the present disclosure.

FIGS. 4A and 4B are a cross-sectional illustration and a plan view illustration, respectively, of another electronic package with an open cavity bridge, in accordance with another embodiment of the present disclosure.

FIGS. 5A and 5B are a cross-sectional illustration and a plan view illustration, respectively, of a bridge die, in accordance with another embodiment of the present disclosure.

FIGS. 7A-7D are cross-sectional illustrations of various electronic packages with an open cavity bridge, in accordance with another embodiment of the present disclosure.

EMBODIMENTS OF THE PRESENT DISCLOSURE

Figure 1:
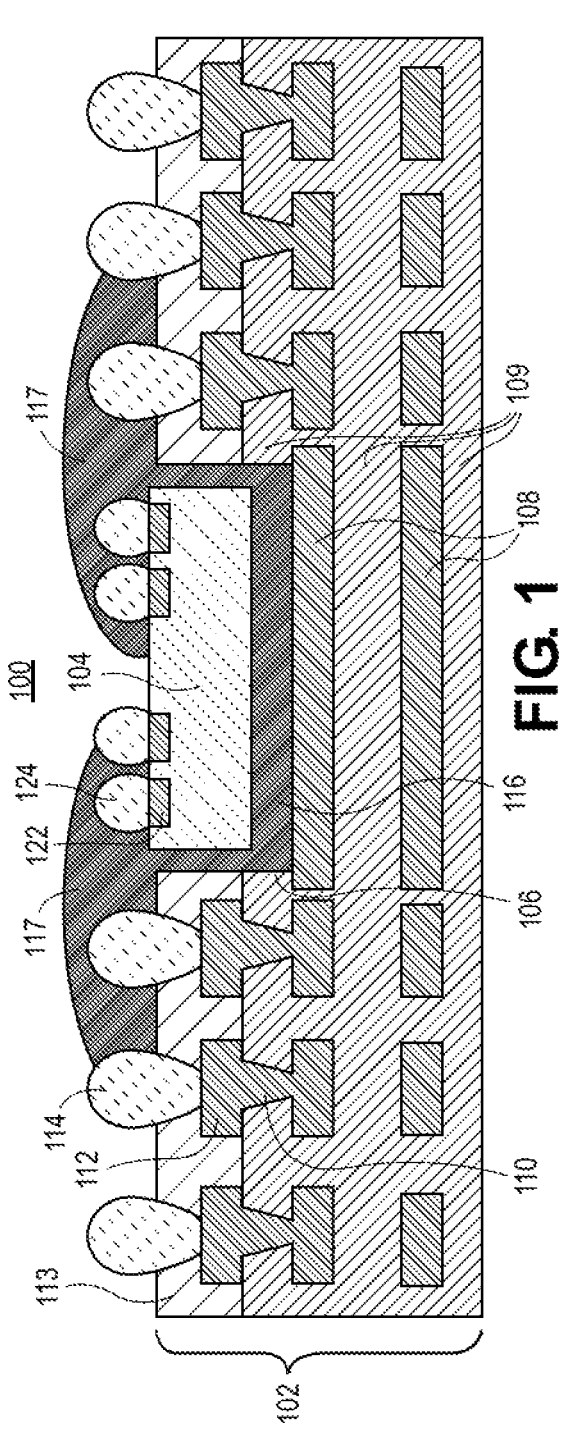
FIG. 1 is a cross-sectional illustration of an electronic package with an open cavity bridge.

Described herein are multi-die packages with open cavity bridges, in accordance with various embodiments. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, partitioned die architectures are limited, at least in part, by the interconnect architectures used to couple the partitioned dies together. For example, the use of embedded multi-die interconnect bridge (EMIB) architectures is limited by bump thickness variation (BTV) considerations. Attempts to improve BTV in EMIB architectures by using a glass patch have been unsuccessful to date. Particularly, the glass patch requires the use of mass reflow techniques for mid-level interconnects (MLIs). Since mass reflow requires larger bump pitches, a redistribution layer (RDL) must be added to the glass patch to accommodate the pitch translation. The RDL negatively impacts thickness uniformity, negating the benefits of using a glass patch.

Accordingly, embodiments disclosed herein include an electronic package that includes an open cavity bridge. An open cavity bridge can include passive interconnections and, possibly, may include active regions with transistors or the like.

One or more embodiments describes herein are directed to open cavity bridge co-planar placement architectures and processes. Open cavity bridge architectures described herein may be suitable for connected multiple die while offering lower cost, high bandwidth solutions. In an example, it may be critical to place a bridge at a correct Z height with respect to a bump field. Embodiments described herein can be implemented to address such issues.

To provide context, past solutions have involved placement of a bridge die in an open cavity as is, and absorbing any Z height differences in process optimization. However, such an approach can limit the bump pitch on top (interconnected) dice and the bridge die. Other past solutions have involved co-planar placement with respect to the bump field. However, such an approach may require a variable thickness glue, which is challenging for processing.

Advantages to implementing open cavity architectures as described herein can include the opportunity to maintain processing for a package substrate portion at a wider pitch. Scaling to finer feature can be confined to a silicon bridge die. Additionally, die thickness may not be constrained by a chip gap. It is to be appreciated that an open cavity bridge architecture as described herein may be differentiated from an EMIB in that an open cavity bridge is not necessarily covered in or sealed within a package substrate-like interlayer dielectric (ILD) layer.

In accordance with embodiments of the present disclosure, several co-planar arrangements of open cavity bridge architectures are disclosed herein. In an embodiment, a pre-filled underfill/glue is used to adjust a cavity depth, which can enable ease of attachment of a bridge at a correct Z height. In another embodiment, solder is effectively used as a glue, where the solder can be applied with very accurate volume control by placing microballs or plating. The solder may wet only exposed metal surfaces and, as such, may be less prone to overflow. In another embodiment, excess adhesive is managed by trenches and reservoirs, which can be used to fill an under-bridge gap and also accommodate excess underfill (UF) volume. In another embodiment, extra non-connect bumps and/or mold material are included on a bridge die to provide strong surfaces for handling the bridge die and protect die edges during handling. In another embodiment, a nozzle stop feature is included on the package substrate to provide protection during thermal compression bonding of the bridge die to the package substrate to achieve a correct Z-height.

To provide context, adhesive overflow may occur since adhesive dispense can be associated with high variations in volume and may be difficult to control. Cavity depth can also be associated with high variations which effectively changes the open cavity volume. As an example, for comparative purposes, FIG. 1 is a cross-sectional illustration of an electronic package with an open cavity bridge.

Referring to FIG. 1, an electronic apparatus 100 includes a package substrate 102 having alternating metallization layers 108 and dielectric layers 109. The package substrate 102 includes a first plurality of substrate pads (left 112s) and a second plurality of substrate pads (right 112s), which may be coupled to the metallization layers 108 by conductive vias 110. An open cavity 106 is between the first plurality of substrate pads (left 112s) and the second plurality of substrate pads (right 112s). The open cavity 106 has a bottom and sides. A bridge die 104 is in the open cavity 106. The bridge die 104 includes a first plurality of bridge pads (left 122s), a second plurality of bridge pads (right 122s), and may further include conductive traces (not depicted). Solder structures 114 are coupled to the substrate pads 112, and may include a solder resist 113 there between. Solder structures 124 are coupled to the bridge pads 122. An adhesive 116 couples the bridge die 104 to the bottom of the open cavity 106. However, depending on the nature of the dispensing of the adhesive 116, overflowing adhesive portions 117 can undesirably be formed on some of the solder structures 114 and 124, which may render the structure 100 inoperable for coupling to dies.

It is to be appreciated that an open cavity bridge (OCB) architecture requires that a bridge die placement have Z alignment of bridge bumps to substrate or core bumps. In addition to possibly leading to overflow, an adhesive dispense approach to form adhesive 116 also may not provide a consistent placement of the bridge within the open cavity 106 and/or may not accommodate for variations in cavity depth. Furthermore, requirements of cavity depth tolerance may render the use of a die attach file (DAF) as insufficient for bridge die placement.

In a first aspect, an open cavity is pre-filled to achieve a desired Z height. An incoming cavity depth and BTV are measured and the cavity is filled. The resulting pre-filled cavity includes an UF/adhesive/film having a controlled UF amount and/or correct thickness. In one embodiment, UF dots are dropped into the open cavity with an intended filler size (e.g., use of a solder sphere, polymer spheres, Cu balls, solder paste with pre-defined particle size) for improved control. The approach can minimize complexity, aid with UF overflow issues, and/or aid with conducting heat from a pedestal to the bridge during thermocompression bonding (TCB). As an example, FIG. 2 is a cross-sectional illustration of an electronic package with an open cavity bridge, in accordance with an embodiment of the present disclosure.

Figure 2:
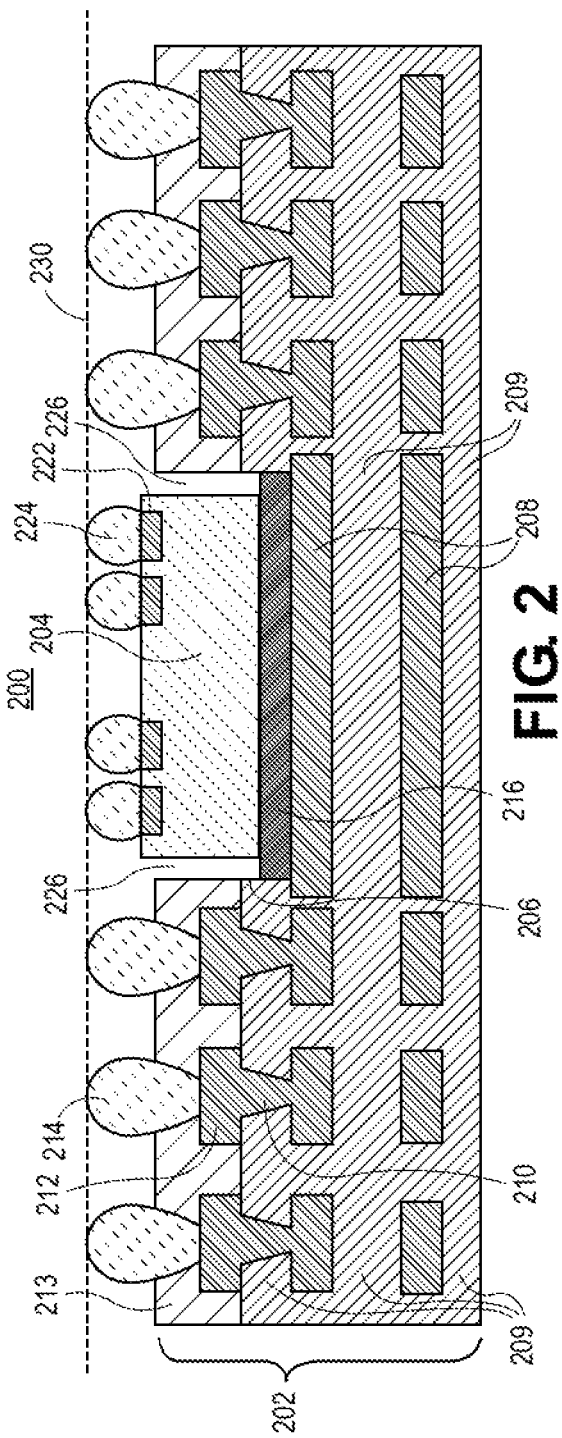
FIG. 2 is a cross-sectional illustration of an electronic package with an open cavity bridge, in accordance with an embodiment of the present disclosure.

Referring to FIG. 2, an electronic apparatus 200 includes a package substrate 202 having alternating metallization layers 208 and dielectric layers 209. The package substrate 202 includes a first plurality of substrate pads (left 212s) and a second plurality of substrate pads (right 212s), which may be coupled to the metallization layers 208 by conductive vias 210. An open cavity 206 is between the first plurality of substrate pads (left 212s) and the second plurality of substrate pads (right 212s). The open cavity 206 has a bottom and sides. A bridge die 204 is in the open cavity 206. The bridge die 204 includes a first plurality of bridge pads (left 222s), a second plurality of bridge pads (right 222s), and may further include conductive traces (not depicted). An adhesive layer 216 couples the bridge die 204 to the bottom of the open cavity 206. A gap 226 is laterally between the bridge die 204 and the sides of the open cavity 206. The gap 226 surrounds the bridge die 204.

In an embodiment, electronic apparatus 200 can further include a first die coupled to the first plurality of substrate pads (left 212s) and the first plurality of bridge pads (left 222s), and a second die coupled to the second plurality of substrate pads (right 212s) and the second plurality of bridge pads (right 212s), exemplary arrangements for which are described in greater detail below. The second die may be coupled to the first die by the conductive traces of the bridge die 204. In one embodiment, such a first die is coupled to the first plurality of substrate pads (left 212s) and to the first plurality of bridge pads (left 222s) by a first plurality of solder structures (e.g., left substrate solder structures 214 and left bridge solder structures 224), and the second die is coupled to the second plurality of substrate pads (right 212s) and the second plurality of bridge pads (right 222s) by a second plurality of solder structures (e.g., right substrate solder structures 214 and right bridge solder structures 224). A solder resist 213 may be included between adjacent ones of the substrate solder structures 214, as is depicted. In an embodiment, electronic apparatus 200 can further include a board coupled to a side of the package substrate 202 opposite the first die and the second die, exemplary arrangements for which are described in greater detail below.

In an embodiment, adjacent pads of the first plurality of bridge pads (left 222s) and adjacent pads of the second plurality of bridge pads (right 222s) have a first pitch, and adjacent pads of the first plurality of substrate pads (left 212s) and adjacent pads of the second plurality of substrate pads (right 212s) have a second pitch greater than the first pitch. In one such embodiment, the first pitch is less than approximately 100 µm and the second pitch is greater than approximately 100 µm.

In an embodiment, adhesive layer 216 is epoxy based and may include fillers such as silica. In an embodiment, adhesive layer 216 is directly on a metallization layer 208, as depicted, or can be on a dielectric layer 209 of the package substrate 202. In an embodiment, adhesive layer 216 is selected on a case by case (cavity by cavity) basis to have a thickness suitable to provide co-planarity of substrate solder structures 214 and bridge 224 along a plane 230. Adhesive layer 216 may be referred to as a pre-filled underfill (UF) layer.

In another aspect, solder is used as an adhesive. Solder may be better controlled in volume. For such cases, a bridge die backside may be metalized, enabling the solder to preferentially wet the die backside instead of squeezing out of the cavity. As an example, FIG. 3 is a cross-sectional illustration of another electronic package with an open cavity bridge, in accordance with another embodiment of the present disclosure.

Referring to FIG. 3, an electronic apparatus 300 includes a package substrate 302 having alternating metallization layers 308 and dielectric layers 309. The package substrate 302 includes a first plurality of substrate pads (left 312s) and a second plurality of substrate pads (right 312s), which may be coupled to the metallization layers 308 by conductive vias 310. An open cavity 306 is between the first plurality of substrate pads (left 312s) and the second plurality of substrate pads (right 312s). The open cavity 306 has a bottom and sides, with the bottom having an exposed metal layer 308. A bridge die 304 is in the open cavity 306. The bridge die 304 has a first side including a first plurality of bridge pads (left 322s), a second plurality of bridge pads (right 322s), and may further include conductive traces (not depicted). The bridge die 304 has a second side opposite the first side, the second side including a metallization layer 305. Solder structures 316 couple the bridge die 304 to the bottom of the open cavity 306. The solder structures 316 are in contact with the metallization layer 305 of the bridge die 304, and are in contact with the exposed metal layer 308 of the bottom of the open cavity 306. In an embodiment, a gap 326 is laterally between the bridge die 304 and the sides of the open cavity 306. The gap 326 surrounds the bridge die 304.

In an embodiment, electronic apparatus 300 can further include a first die coupled to the first plurality of substrate pads (left 312s) and the first plurality of bridge pads (left 322s), and a second die coupled to the second plurality of substrate pads (right 312s) and the second plurality of bridge pads (right 322s), exemplary arrangements for which are described in greater detail below. The second die may be coupled to the first die by the conductive traces of the bridge die 304. In one embodiment, such a first die is coupled to the first plurality of substrate pads (left 312s) and to the first plurality of bridge pads (left 322s) by a first plurality of solder structures (e.g., left substrate solder structures 314 and left bridge solder structures 324), and the second die is coupled to the second plurality of substrate pads (right 312s) and the second plurality of bridge pads (right 322s) by a second plurality of solder structures (e.g., right substrate solder structures 314 and right bridge solder structures 324). A solder resist 313 may be included between adjacent ones of the substrate solder structures 314, as is depicted. In an embodiment, electronic apparatus 300 can further include a board coupled to a side of the package substrate 302 opposite the first die and the second die, exemplary arrangements for which are described in greater detail below.

In an embodiment, adjacent pads of the first plurality of bridge pads (left 322s) and adjacent pads of the second plurality of bridge pads (right 322s) have a first pitch, and adjacent pads of the first plurality of substrate pads (left 312s) and adjacent pads of the second plurality of substrate pads (right 312s) have a second pitch greater than the first pitch. In one such embodiment, the first pitch is less than approximately 100 µm and the second pitch is greater than approximately 100 µm.

In another aspect, excess adhesive management architectures are described. Adhesive dispense can have high variations in volume and may be difficult to control. Cavity depth can also have high variations which can change the open cavity volume. Excess adhesive volume from a die attach film (DAF) or from dispensed underfill can be carried out by trenches by capillary force. Excess volume can be used to fill trenches in a base Cu (e.g., as fabricated using a laser). Trenches can also be used to fill capillary underfill in the open cavity. As an example, FIGS. 4A and 4B are a cross-sectional illustration and a plan view illustration, respectively, of another electronic package with an open cavity bridge, in accordance with another embodiment of the present disclosure.

Figure 4B:
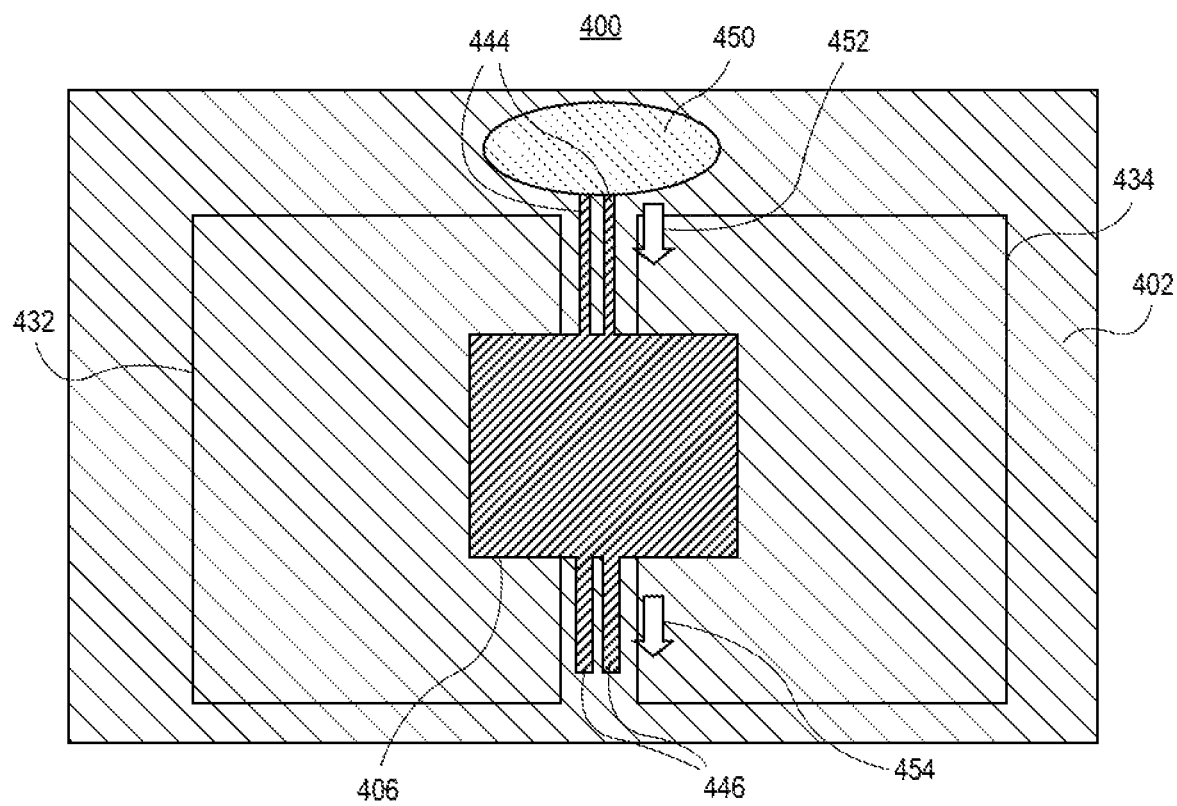

Referring to FIGS. 4A and 4B, an electronic apparatus 400 includes a package substrate 402 having alternating metallization layers 408 and dielectric layers 409. The package substrate 402 includes a first plurality of substrate pads (left 412s) and a second plurality of substrate pads (right 412s), which may be coupled to the metallization layers 408 by conductive vias 410. An open cavity 406 is between the first plurality of substrate pads (left 412s) and the second plurality of substrate pads (right 412s). The open cavity 406 has a bottom and sides. The open cavity 406 has a bottom and sides, the bottom having a plurality of trenches 444 therein. A bridge die 404 is in the open cavity 406. The bridge die 404 includes a first plurality of bridge pads (left 422s), a second plurality of bridge pads (right 422s), and may further include conductive traces (not depicted). An adhesive layer 416 couples the bridge die 404 to the bottom of the open cavity 406. The adhesive layer 416 is in the plurality of trenches 444 of the open cavity 406.

In an embodiment, the trenches 444 extend beyond one or more sides of the open cavity 406, as depicted in FIG. 4B. In an embodiment, the trenches 444 extending beyond one side of the open cavity 406 have a first thickness, while the trenches 444 extending beyond one side of the open cavity 406 have a second thickness greater than the first thickness (labeled as trenches 446 in FIG. 4B). In an embodiment, an adhesive 416 is applied at location 450 and provided into trenches 444 along direction 452. The adhesive 416 enters open cavity 406 to affix a bridge die 404 in the open cavity 406. Excess amounts of adhesive 416 are flowed out through trenches 446 along direction 454. In an embodiment, trench widths can be varied (e.g., as wider trenches 446 versus narrower trenches 444) from one side to another in a trench or different trench widths can be used to achieve different capillary forces to pull capillary underfill in a desired direction, e.g., away from the die in case of excess material dispensed under the die or in to the die when the underfill is dispensed outside at 450.

In an embodiment, a gap 426 is laterally between the bridge die 404 and the sides of the open cavity 406. The gap 426 surrounds the bridge die 404, as depicted. In an embodiment, adhesive 416 fills a lower portion of the gap 426, as is depicted. In other embodiments, the adhesive 416 fills gap 426. In an embodiment, adhesive layer 416 is epoxy based and may include fillers such as silica. In an embodiment, adhesive layer 416 is directly on a metallization layer 408A, as depicted, or can be on a dielectric layer 409 of the package substrate 402. That is, in an embodiment, the plurality of trenches 444 of the open cavity 406 are in metallization layer 408A, as depicted, or can be in a dielectric layer 409 of the package substrate 402.

In an embodiment, electronic apparatus 400 can further include a first die (e.g., at location 432) coupled to the first plurality of substrate pads (left 412s) and the first plurality of bridge pads (left 422s), and a second die (e.g., at location 434) coupled to the second plurality of substrate pads (right 412s) and the second plurality of bridge pads (right 422s), exemplary arrangements for which are described in greater detail below. The second die may be coupled to the first die by the conductive traces of the bridge die 404. In one embodiment, such a first die is coupled to the first plurality of substrate pads (left 412s) and to the first plurality of bridge pads (left 422s) by a first plurality of solder structures (e.g., left substrate solder structures 414 and left bridge solder structures 424), and the second die is coupled to the second plurality of substrate pads (right 412s) and the second plurality of bridge pads (right 422s) by a second plurality of solder structures (e.g., right substrate solder structures 414 and right bridge solder structures 424). A solder resist 413 may be included between adjacent ones of the substrate solder structures 414, as is depicted. In an embodiment, electronic apparatus 400 can further include a board coupled to a side of the package substrate 402 opposite the first die and the second die, exemplary arrangements for which are described in greater detail below.

In an embodiment, adjacent pads of the first plurality of bridge pads (left 422s) and adjacent pads of the second plurality of bridge pads (right 422s) have a first pitch, and adjacent pads of the first plurality of substrate pads (left 412s) and adjacent pads of the second plurality of substrate pads (right 412s) have a second pitch greater than the first pitch. In one such embodiment, the first pitch is less than approximately 100 µm and the second pitch is greater than approximately 100 µm.

In another aspect, bridge die modification involves the inclusion of extra non-interconnect bumps to pick dies. Such additional features may be included to protect solder from getting damaged during handling, improve uniformity, provide extra SORT bumps to avoid damaging solder during SORT, accommodate an adjustable die size with mold material, protect die edges while lowering a die into a cavity, and/or prevent epoxy from rolling over a bridge die. As an example, FIGS. 5A and 5B are a cross-sectional illustration and a plan view illustration, respectively, of a bridge die, in accordance with another embodiment of the present disclosure.

Referring to FIGS. 5A and 5B, an apparatus 500 includes a bridge die 502 is included in a surrounding mold frame 504. The bridge die 502 and surrounding mold frame 504 pairing may be included in an open cavity of a package substrate. The bridge die 502 includes active interconnect bumps 506. Each active interconnect bump 506 may include a conductive bump 508 and a solder structure 510. A plurality of non-active interconnect bumps (or non-interconnect bumps) 512 are included at a periphery of an active surface of the bridge die 502.

In another aspect, a pedestal stop is included to provide an ability to place dies in a cavity at an appropriate elevation for an open cavity architecture. An oversized nozzle (e.g., greater than the dimensions of the cavity) may be used to place the bridge die in the cavity. Plated non-active structures on the package substrate can act as a nozzle stop. Such embodiments may be implemented to prevent damage to active bumps. As an example, FIGS. 6A and 6B are a cross-sectional illustration and a plan view illustration, respectively, of another electronic package with an open cavity bridge, in accordance with another embodiment of the present disclosure.

Figure 6A:
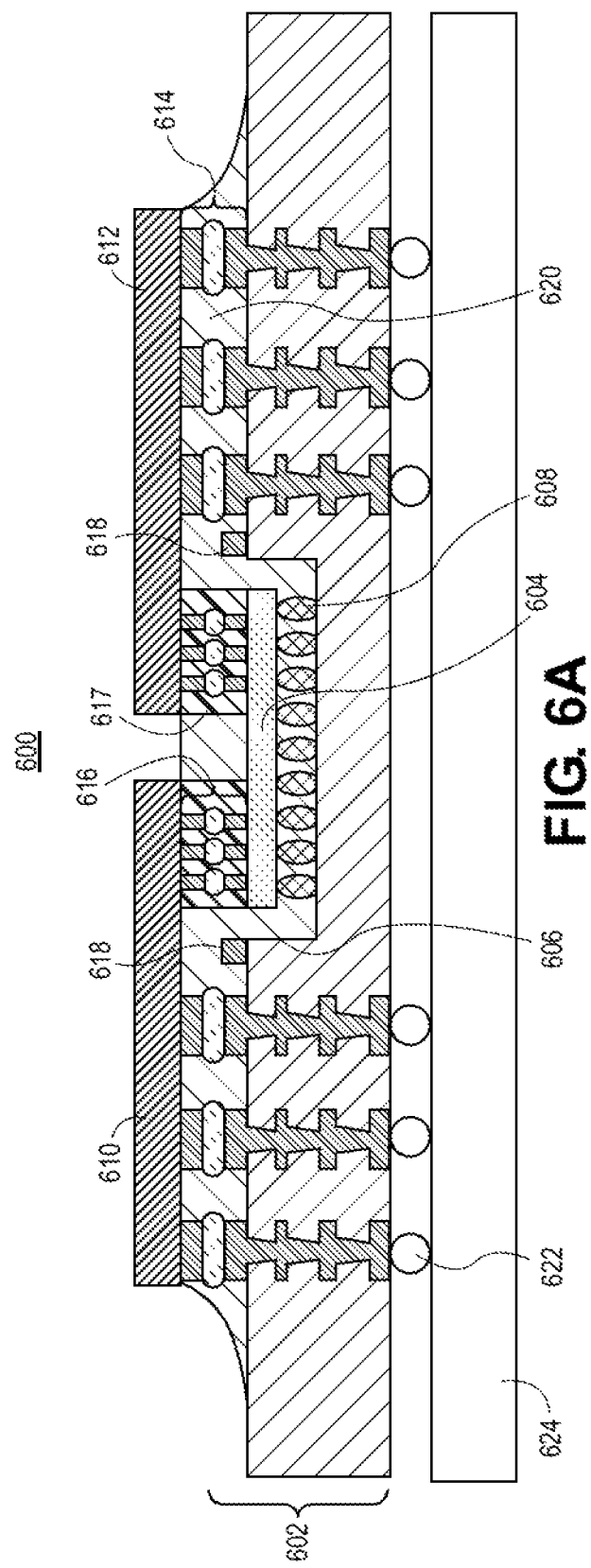
FIGS. 6A and 6B are a cross-sectional illustration and a plan view illustration, respectively, of another electronic package with an open cavity bridge, in accordance with another embodiment of the present disclosure.
Figure 6B:
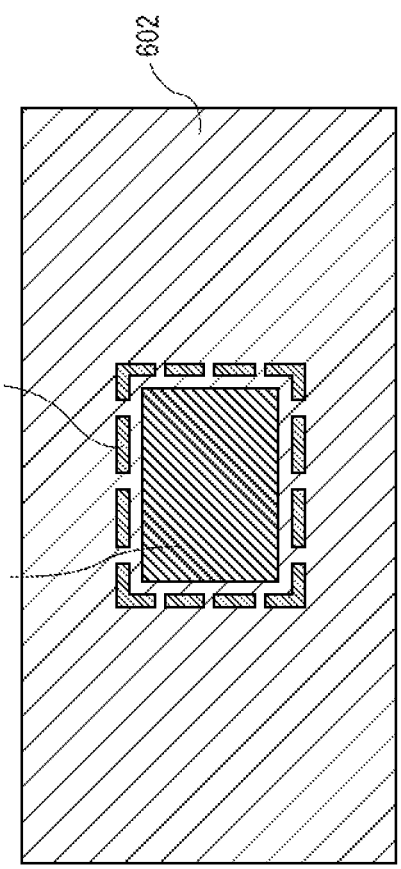

Referring to FIGS. 6A and 6B, an electronic apparatus 600 includes a package substrate 602 having alternating metallization layers and dielectric layers. An active bridge die 604 is in an open cavity 606 in the package substrate 602. The open cavity 606 has a bottom and sides. A plurality of non-active conductive structures 618 surrounds a perimeter of the open cavity 606. As is depicted, a plurality of solder structures 608 couples the bridge die 604 to the bottom of the open cavity 606, such as described above in association with FIG. 3. In another embodiment, an adhesive layer couples the bridge die 604 to the bottom of the open cavity 606, such as described above in association with FIGS. 2, 4A and 4B. In an embodiment, a gap is laterally between the bridge die 604 and the sides of the open cavity 606. The gap surrounds the bridge die 604. Electronic apparatus 600 further includes a first die 610 coupled by substrate interconnects (left 614s) to package substrate 602, and coupled by bridge interconnects (left 616s) to bridge die 604. A second die 612 is coupled by substrate interconnects (right 614s) to package substrate 602, and is coupled by bridge interconnects (right 616s) to bridge die 604. The bridge interconnects 616 may be included in epoxy-based interconnect package structures 617, as is depicted. An underfill material 620 is between the first and second dies 610 and 612 and the package substrate 602, and may further be included in the gap surrounding the bridge die 604, as is depicted. In an embodiment, electronic apparatus 600 can further include a board 624, such as a printed circuit board, coupled to a side of the package substrate 602 opposite the first die 610 and the second die 612, e.g., by solder balls or bumps 622.

FIGS. 7A-7D are cross-sectional illustrations of various electronic packages with an open cavity bridge, in accordance with another embodiment of the present disclosure.

Referring to FIG. 7A, an electronic apparatus 700 includes a package substrate 702 having alternating metallization layers and dielectric layers. An active bridge die 704 is in an open cavity 706 in the package substrate 702. The open cavity 706 has a bottom and sides. An adhesive layer 708 couples the bridge die 704 to the bottom of the open cavity 706, such as described above in association with FIG. 2. In an embodiment, a gap is laterally between the bridge die 704 and the sides of the open cavity 706. The gap surrounds the bridge die 704. Electronic apparatus 700 further includes a first die 710 coupled by substrate interconnects (left 714s) to package substrate 702, and coupled by bridge interconnects (left 716s) to bridge die 704. A second die 712 is coupled by substrate interconnects (right 714s) to package substrate 702, and is coupled by bridge interconnects (right 716s) to bridge die 704. An underfill material 720 is between the first and second dies 710 and 712 and the package substrate 702, and may further be included in the gap surrounding the bridge die 704, as is depicted. In an embodiment, electronic apparatus 700 can further include a board 724, such as a printed circuit board, coupled to a side of the package substrate 702 opposite the first die 710 and the second die 712, e.g., by solder balls or bumps 722.

Referring to FIG. 7B, an electronic apparatus 750 includes a package substrate 702 having alternating metallization layers and dielectric layers. An active bridge die 704 is in an open cavity 706 in the package substrate 702. The open cavity 706 has a bottom and sides. An adhesive layer 708 couples the bridge die 704 to the bottom of the open cavity 706, such as described above in association with FIG. 2. In an embodiment, a gap is laterally between the bridge die 704 and the sides of the open cavity 706. The gap surrounds the bridge die 704. Electronic apparatus 700 further includes a first die 710 coupled by substrate interconnects (left 714s) to package substrate 702, and coupled by bridge interconnects (left 716s) to bridge die 704. A second die 712 is coupled by substrate interconnects (right 714s) to package substrate 702, and is coupled by bridge interconnects (right 716s) to bridge die 704. The bridge interconnects 716 are included in epoxy-based interconnect package structures 717. An underfill material 720 is between the first and second dies 710 and 712 and the package substrate 702, and may further be included in the gap surrounding the bridge die 704, as is depicted. In an embodiment, electronic apparatus 750 can further include a board 724, such as a printed circuit board, coupled to a side of the package substrate 702 opposite the first die 710 and the second die 712, e.g., by solder balls or bumps 722.

Referring to FIG. 7C, an electronic apparatus 760 includes a package substrate 702 having alternating metallization layers and dielectric layers. An active bridge die 704 is in an open cavity 706 in the package substrate 702. The open cavity 706 has a bottom and sides. An adhesive layer 758 couples the bridge die 704 to the bottom of the open cavity 706, and may further be along sidewalls of the bridge die 704 and the sides of the open cavity 706, as is depicted. Electronic apparatus 760 further includes a first die 710 coupled by substrate interconnects (left 714s) to package substrate 702, and coupled by bridge interconnects (left 716s) to bridge die 704. A second die 712 is coupled by substrate interconnects (right 714s) to package substrate 702, and is coupled by bridge interconnects (right 716s) to bridge die 704. The bridge interconnects 716 may be included in epoxy-based interconnect package structures 717, as is depicted. An underfill material 720 is between the first and second dies 710 and 712 and the package substrate 702, and may further be included in the gap surrounding the bridge die 704, as is depicted. In an embodiment, electronic apparatus 760 can further include a board 724, such as a printed circuit board, coupled to a side of the package substrate 702 opposite the first die 710 and the second die 712, e.g., by solder balls or bumps 722.

Referring to FIG. 7D, an electronic apparatus 770 includes a package substrate 702 having alternating metallization layers and dielectric layers. An active bridge die 704 is in an open cavity 706 in the package substrate 702. The open cavity 706 has a bottom and sides. A plurality of solder structures 778 couples the bridge die 704 to the bottom of the open cavity 706, such as described above in association with FIG. 3. Electronic apparatus 770 further includes a first die 710 coupled by substrate interconnects (left 714s) to package substrate 702, and coupled by bridge interconnects (left 716s) to bridge die 704. A second die 712 is coupled by substrate interconnects (right 714s) to package substrate 702, and is coupled by bridge interconnects (right 716s) to bridge die 704. The bridge interconnects 716 may be included in epoxy-based interconnect package structures 717, as is depicted. An underfill material 720 is between the first and second dies 710 and 712 and the package substrate 702, and may further be included in the gap surrounding the bridge die 704, as is depicted. In an embodiment, electronic apparatus 770 can further include a board 724, such as a printed circuit board, coupled to a side of the package substrate 702 opposite the first die 710 and the second die 712, e.g., by solder balls or bumps 722.

It is to be appreciated that a variety of possibilities exist for bridge die arrangements relative to the interconnected dies. As example, FIGS. 8A-8D are plan view illustrations of various electronic packages with an open cavity bridge, in accordance with another embodiment of the present disclosure.

Figure 8A:
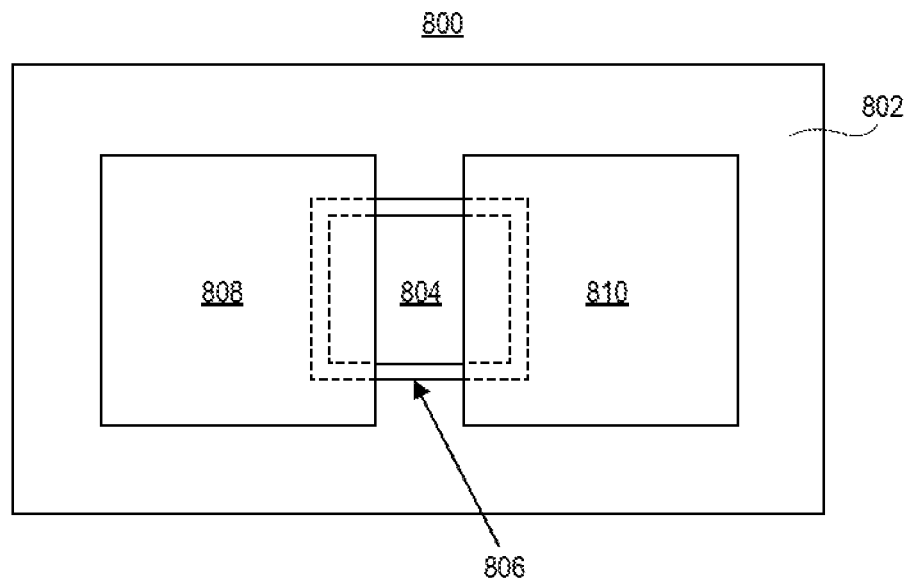
FIGS. 8A-8D are plan view illustrations of various electronic packages with an open cavity bridge, in accordance with another embodiment of the present disclosure.

Referring to FIG. 8A, an electronic package 800 includes a package substrate 802 having an open cavity 806 therein. A bridge die 804 is in the open cavity 806. A first die 808 and a second die 810 are coupled together by the bridge die 804. The first die 808 and the second die 810 have a linear arrangement with respect to the bridge die 804.

Figure 8B:
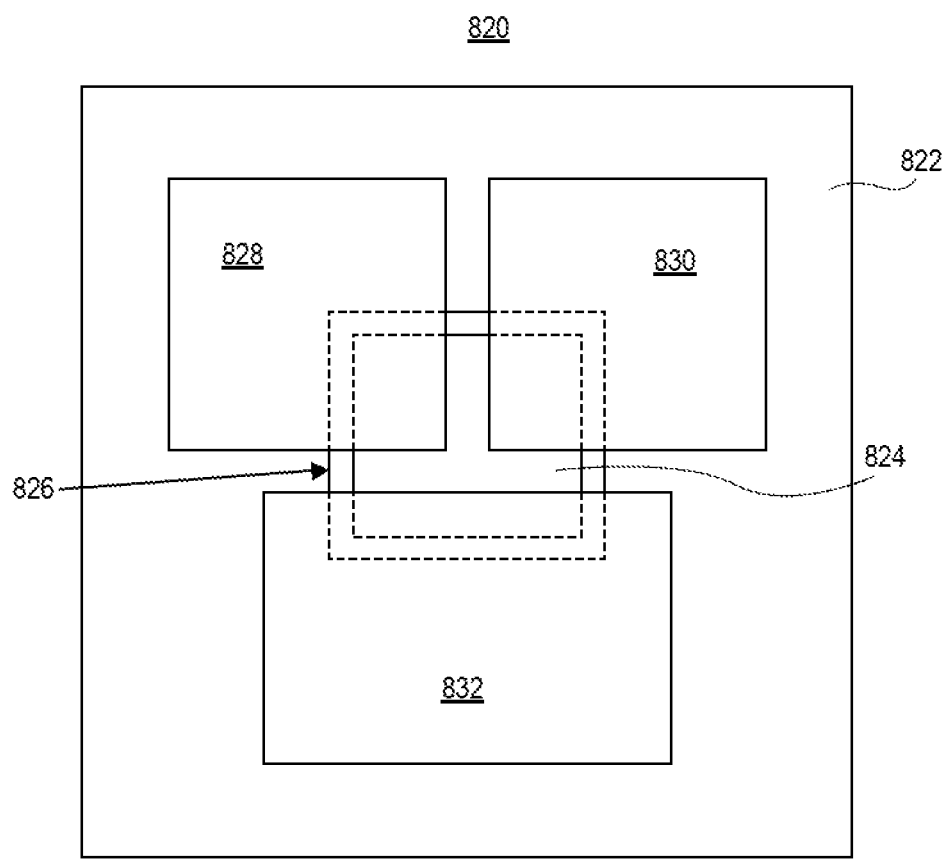

Referring to FIG. 8B, an electronic package 820 includes a package substrate 822 having an open cavity 826 therein. A bridge die 824 is in the open cavity 826. A first die 828, a second die 830, and a third die 832 are coupled together by the bridge die 824.

Figure 8C:
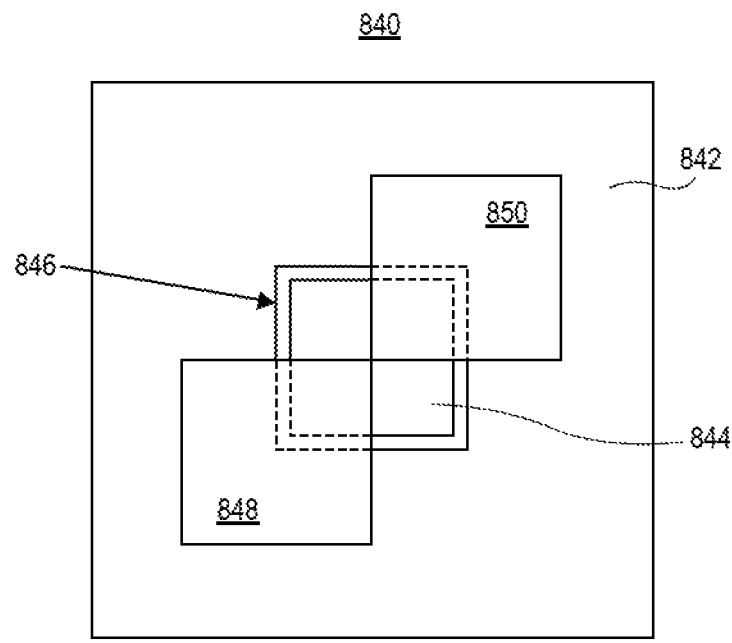

Referring to FIG. 8C, an electronic package 840 includes a package substrate 842 having an open cavity 846 therein. A bridge die 844 is in the open cavity 846. A first die 848 and a second die 850 are coupled together by the bridge die 844. The first die 848 and the second die 850 have a diagonal arrangement with respect to the bridge die 844.

Figure 8D:
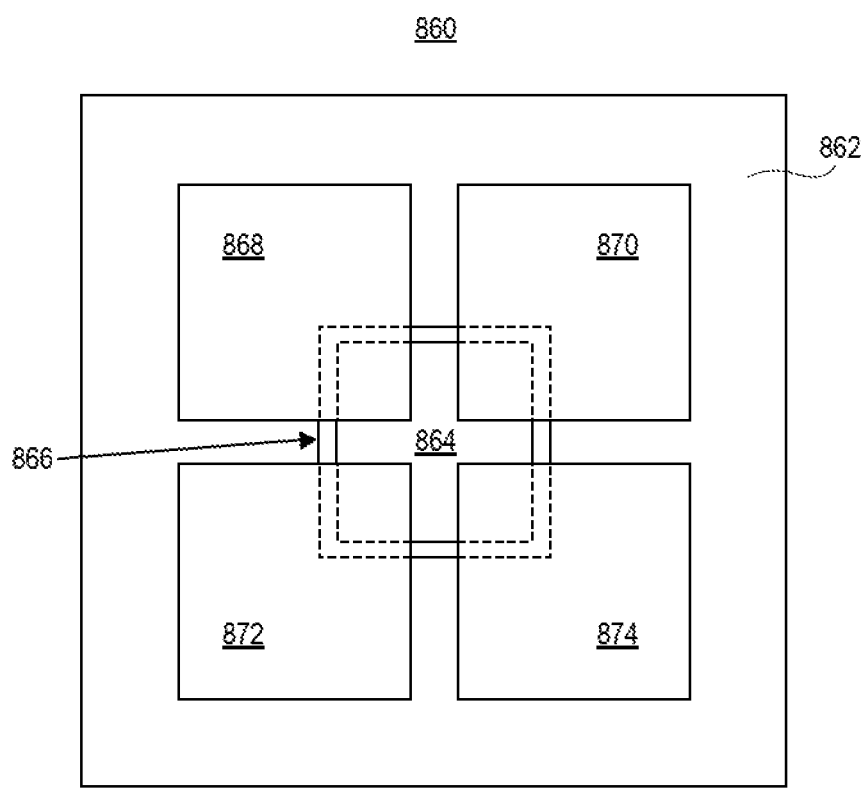

Referring to FIG. 8D, an electronic package 860 includes a package substrate 862 having an open cavity 866 therein. A bridge die 864 is in the open cavity 866. A first die 868, a second die 870, a third die 872, and a fourth die 874 are coupled together by the bridge die 864.

In an embodiment, a bridge die as described herein may include any suitable substrate material. In an embodiment, a bridge die as described herein is a silicon (Si) bridge die. In an embodiment, a bridge die as described herein includes glass, ceramic, semiconductor materials (e.g., high or low resistivity silicon, group III-V semiconductors, or the like), or organic substrates (high density interconnect (HDI) substrates, embedded trace substrates (ETS), high density package (HDP) substrates, molded substrates, or the like). In some embodiments, a bridge die is a passive device. That is, the bridge die may include only passive components (e.g., traces, vias, etc.). In other embodiments, the bridge die may be an active interposer. That is, the bridge die may include active devices (e.g., transistors etc.).

In an embodiment, a bridge die has an active surface. While referred to as an "active" surface, it is to be appreciated that the active surface may include entirely passive features. In an embodiment, the bridge die may include through component vias (TCVs). The TCVs may electrically couple the active surface to pads on the backside of the bridge die. In an embodiment, the bridge die has first level interconnects (FLIs) such as a copper bump, a solder, or any other suitable FLI interconnect architecture.

In an embodiment, a plurality of dies coupled by a bridge die may be any type of dies. For example, the dies may be processor dies, memory dies, graphics dies, or the like. In an embodiment, the dies may be embedded in a mold layer. An underfill layer may also partially embed the dies and surround interconnects below the dies, exemplary structures of which are described above.

Figure 9:
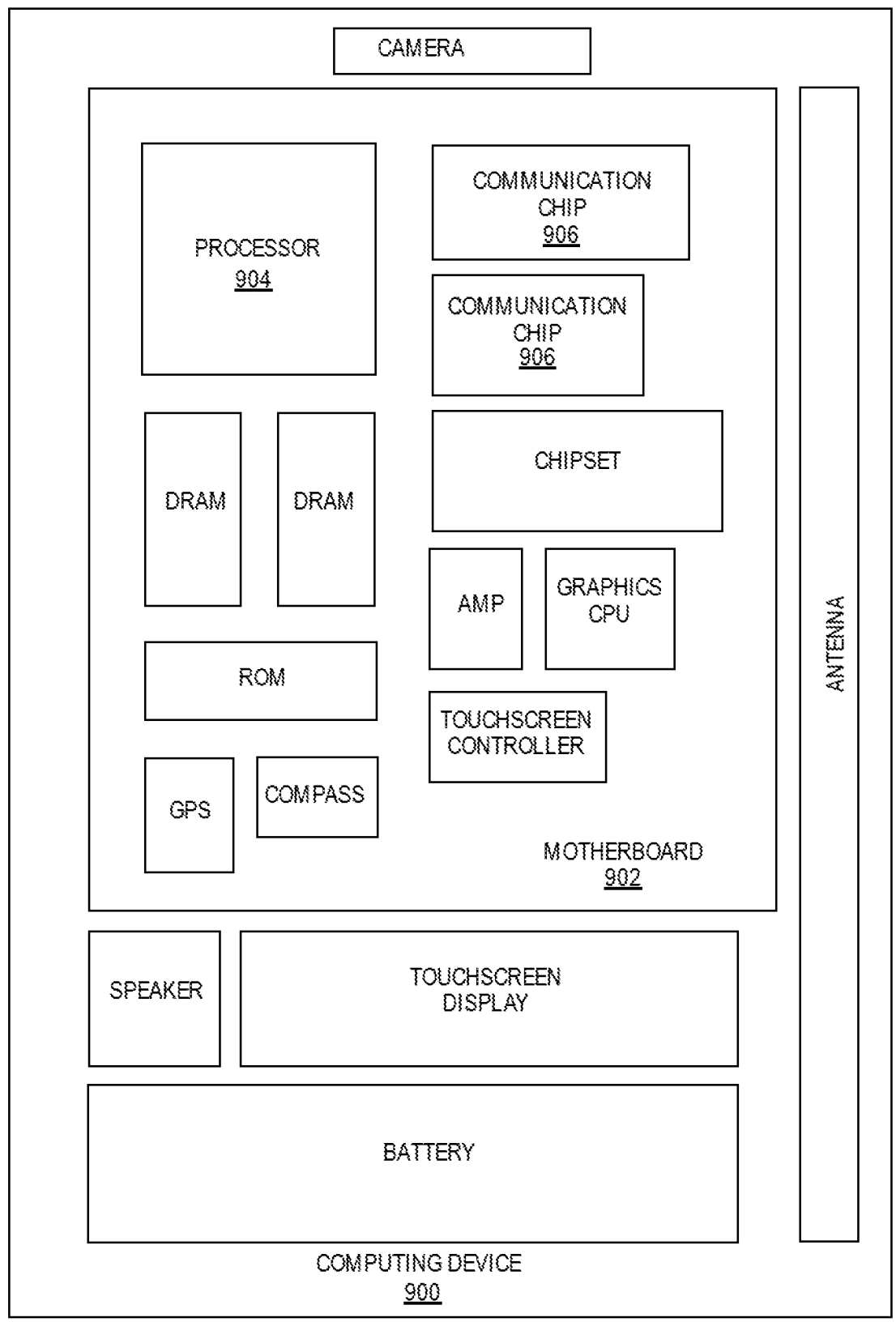
FIG. 9 is a schematic of a computing device built in accordance with an embodiment of the present disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations, the integrated circuit die of the processor 904 may be part of an electronic package that includes an open cavity bridge, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation, the integrated circuit die of the communication chip 906 may be part of an electronic package that includes an open cavity bridge, in accordance with embodiments described herein.

Thus, multi-die packages with open cavity bridges are described herein.

The above description of illustrated implementations, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An electronic apparatus includes a package substrate having alternating metallization layers and dielectric layers. The package substrate includes a first plurality of substrate pads and a second plurality of substrate pads. The package substrate also includes an open cavity between the first plurality of substrate pads and the second plurality of substrate pads, the open cavity having a bottom and sides. The electronic apparatus also includes a bridge die in the open cavity, the bridge die including a first plurality of bridge pads, a second plurality of bridge pads, and conductive traces. An adhesive layer couples the bridge die to the bottom of the open cavity. A gap is laterally between the bridge die and the sides of the open cavity, the gap surrounding the bridge die.

Example embodiment 2: The electronic apparatus of example embodiment 1, further including a first die coupled to the first plurality of substrate pads and the first plurality of bridge pads, and a second die coupled to the second plurality of substrate pads and the second plurality of bridge pads, the second die coupled to the first die by the conductive traces of the bridge die.

Example embodiment 3: The electronic apparatus of example embodiment 2, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

Example embodiment 4: The electronic apparatus of example embodiment 2 or 3, further including a board coupled to a side of the package substrate opposite the first die and the second die.

Example embodiment 5: The electronic apparatus of example embodiment 1, 2, 3 or 4, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

Example embodiment 6: The electronic apparatus of example embodiment 5, wherein the first pitch is less than approximately 100 μm and the second pitch is greater than approximately 100 μm.

Example embodiment 7: An electronic apparatus includes a package substrate having alternating metallization layers and dielectric layers. The package substrate includes a first plurality of substrate pads and a second plurality of substrate pads. The substrate also includes and an open cavity between the first plurality of substrate pads and the second plurality of substrate pads, the open cavity having a bottom and sides, the bottom having an exposed metal layer. The electronic apparatus also includes a bridge die in the open cavity, the bridge die having a first side including a first plurality of bridge pads, a second plurality of bridge pads, and conductive traces, and the bridge die having a second side including a metallization layer. Solder structures couple the bridge die to the bottom of the open cavity, the solder structures in contact with the metallization layer of the bridge die and in contact with the exposed metal layer of the bottom of the open cavity.

Example embodiment 8: The electronic apparatus of example embodiment 7, further including a gap laterally between the bridge die and the sides of the open cavity, the gap surrounding the bridge die.

Example embodiment 9: The electronic apparatus of example embodiment 7 or 8, further including a first die coupled to the first plurality of substrate pads and the first plurality of bridge pads, and a second die coupled to the second plurality of substrate pads and the second plurality of bridge pads, the second die coupled to the first die by the conductive traces of the bridge die.

Example embodiment 10: The electronic apparatus of example embodiment 9, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

Example embodiment 11: The electronic apparatus of example embodiment 9 or 10, further including a board coupled to a side of the package substrate opposite the first die and the second die.

Example embodiment 12: The electronic apparatus of example embodiment 7, 8, 9, 10 or 11, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

Example embodiment 13: The electronic apparatus of example embodiment 12, wherein the first pitch is less than approximately 100 µm and the second pitch is greater than approximately 100 µm.

Example embodiment 14: An electronic apparatus includes a package substrate having alternating metallization layers and dielectric layers. The package substrate includes a first plurality of substrate pads and a second plurality of substrate pads. The package substrate also includes an open cavity between the first plurality of substrate pads and the second plurality of substrate pads, the open cavity having a bottom and sides, the bottom having a plurality of trenches therein. The electronic apparatus also includes a bridge die in the open cavity, the bridge die including a first plurality of bridge pads, a second plurality of bridge pads, and conductive traces. An adhesive layer couples the bridge die to the bottom of the open cavity, the adhesive layer in the plurality of trenches of the open cavity.

Example embodiment 15: The electronic apparatus of example embodiment 14, wherein the trenches extend beyond one or more sides of the open cavity.

Example embodiment 16: The electronic apparatus of example embodiment 14 or 15, further including a gap laterally between the bridge die and the sides of the open cavity, the gap surrounding the bridge die.

Example embodiment 17: The electronic apparatus of example embodiment 14, 15 or 16, further including a first die coupled to the first plurality of substrate pads and the first plurality of bridge pads; and a second die coupled to the second plurality of substrate pads and the second plurality of bridge pads, the second die coupled to the first die by the conductive traces of the bridge die.

Example embodiment 18: The electronic apparatus of example embodiment 17, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

Example embodiment 19: The electronic apparatus of example embodiment 17 or 18, further including a board coupled to a side of the package substrate opposite the first die and the second die.

Example embodiment 20: The electronic apparatus of example embodiment 14, 15, 16, 17, 18 or 19, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

Example embodiment 21: The electronic apparatus of example embodiment 20, wherein the first pitch is less than approximately 100 µm and the second pitch is greater than approximately 100 µm.

Example embodiment 22: An electronic apparatus includes a package substrate having alternating metallization layers and dielectric layers. The package substrate includes a first plurality of substrate pads and a second plurality of substrate pads. The electronic apparatus also includes an open cavity between the first plurality of substrate pads and the second plurality of substrate pads, the open cavity having a bottom and sides. A plurality of non-active conductive structures surrounds a perimeter of the open cavity. The electronic apparatus also includes a bridge die in the open cavity and coupled to the bottom of the open cavity, the bridge die including a first plurality of bridge pads, a second plurality of bridge pads, and conductive traces.

Example embodiment 23: The electronic apparatus of example embodiment 22, further including a gap laterally between the bridge die and the sides of the open cavity, the gap surrounding the bridge die.

Example embodiment 24: The electronic apparatus of example embodiment 22 or 23, further including a first die coupled to the first plurality of substrate pads and the first plurality of bridge pads, and a second die coupled to the second plurality of substrate pads and the second plurality of bridge pads, the second die coupled to the first die by the conductive traces of the bridge die.

Example embodiment 25: The electronic apparatus of example embodiment 24, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

Example embodiment 26: The electronic apparatus of example embodiment 24 or 25, further including a board coupled to a side of the package substrate opposite the first die and the second die.

Example embodiment 27: The electronic apparatus of example embodiment 22, 23, 24, 25 or 26, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

Example embodiment 28: The electronic apparatus of example embodiment 27, wherein the first pitch is less than approximately 100 µm and the second pitch is greater than approximately 100 µm.

What is claimed is:

1. An electronic apparatus, comprising:
a package substrate having alternating metallization layers and dielectric layers, the package substrate comprising:
 a first plurality of substrate pads and a second plurality of substrate pads;
 an open cavity between the first plurality of substrate pads and the second plurality of substrate pads, the open cavity having a bottom and sides; and a plurality of conductive vias directly coupling the metallization layers and the substrate pads; and
a bridge die in the open cavity, the bridge die comprising a first plurality of bridge pads, a second plurality of bridge pads, and conductive traces;
an adhesive layer coupling the bridge die to the bottom of the open cavity, the adhesive layer beneath and extending laterally beyond outermost sides of the bridge die; and
a gap laterally between the bridge die and the sides of the open cavity, the gap surrounding the bridge die.

2. The electronic apparatus of claim 1, further comprising:
a first die coupled to the first plurality of substrate pads and the first plurality of bridge pads; and
a second die coupled to the second plurality of substrate pads and the second plurality of bridge pads, the second die coupled to the first die by the conductive traces of the bridge die.

3. The electronic apparatus of claim 2, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

4. The electronic apparatus of claim 2, further comprising:
a board coupled to a side of the package substrate opposite the first die and the second die.

5. The electronic apparatus of claim 1, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

6. The electronic apparatus of claim 5, wherein the first pitch is less than approximately 100 μm and the second pitch is greater than approximately 100 μm.

* * * * *